United States Patent
Kim et al.

(10) Patent No.: US 9,118,795 B2
(45) Date of Patent: Aug. 25, 2015

(54) IMAGE SENSORS HAVING VARIABLE VOLTAGE-CURRENT CHARACTERISTICS AND METHODS OF OPERATING THE SAME

(75) Inventors: Ho-jung Kim, Suwon-si (KR); U-in Chung, Seoul (KR); Jai-kwang Shin, Anyang-si (KR); Sun-il Kim, Osan-si (KR); I-hun Song, Seongnam-si (KR); Chang-jung Kim, Yongin-si (KR); Sang-hun Jeon, Yongin-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 595 days.

(21) Appl. No.: 12/805,723

(22) Filed: Aug. 17, 2010

(65) Prior Publication Data

US 2011/0108704 A1    May 12, 2011

(30) Foreign Application Priority Data

Nov. 11, 2009    (KR) .................. 10-2009-0108660

(51) Int. Cl.
    *H01J 27/00*    (2006.01)
    *H04N 9/04*    (2006.01)
    *H04N 5/3745*    (2011.01)
    *H01L 27/146*    (2006.01)

(52) U.S. Cl.
    CPC ............ *H04N 9/045* (2013.01); *H04N 5/3745* (2013.01); *H01L 27/14643* (2013.01)
    USPC ........................................ 250/208.1; 348/241

(58) Field of Classification Search
    CPC ............ H05N 5/35518; H05N 5/3575; H05N 5/3745; H05N 5/37455
    USPC ........................................ 250/208.1; 348/241
    See application file for complete search history.

(56) References Cited

U.S. PATENT DOCUMENTS

| | | | |
|---|---|---|---|
| 6,369,743 B2 * | 4/2002 | Ono .............................. | 341/159 |
| 6,538,693 B1 * | 3/2003 | Kozuka ......................... | 348/241 |
| 7,067,843 B2 | 6/2006 | Carcia et al. | |
| 7,408,210 B2 * | 8/2008 | Ogura et al. .................. | 257/233 |
| 7,521,737 B2 * | 4/2009 | Augusto ....................... | 257/233 |

(Continued)

FOREIGN PATENT DOCUMENTS

| | | |
|---|---|---|
| CN | 1341863 A | 3/2002 |
| JP | 2000-083198 A | 3/2000 |

(Continued)

OTHER PUBLICATIONS

Japanese Office Action dated May 13, 2014 for corresponding Japanese Application No. 2010-247373.

(Continued)

*Primary Examiner* — Thanh Luu
(74) *Attorney, Agent, or Firm* — Harness, Dickey & Pierce, P.L.C.

(57) ABSTRACT

Image sensors and methods of operating the same. An image sensor includes a pixel array including a plurality of pixels. Each of the plurality of pixels includes a photo sensor, the voltage-current characteristics of which vary according to energy of incident light, and that generates a sense current determined by the energy of the incident light; a reset unit that is activated to generate a reference current, according to a reset signal for resetting at least one of the plurality of pixels; and a conversion unit that converts the sense current and the reference current into a sense voltage and a reference voltage, respectively.

30 Claims, 14 Drawing Sheets

(56) References Cited

U.S. PATENT DOCUMENTS

| | | | | |
|---|---|---|---|---|
| 2005/0179964 | A1* | 8/2005 | Izumi | 358/483 |
| 2006/0007329 | A1* | 1/2006 | Panicacci | 348/241 |
| 2008/0054319 | A1 | 3/2008 | Mouli | |
| 2008/0258047 | A1* | 10/2008 | Sakakibara et al. | 250/214 C |
| 2010/0097838 | A1* | 4/2010 | Tanaka et al. | 365/112 |

FOREIGN PATENT DOCUMENTS

| | | |
|---|---|---|
| JP | 2004-047719 A | 2/2004 |
| JP | 2007-158549 A | 6/2007 |
| JP | 2007-184989 A | 7/2007 |
| JP | 2009-182194 A | 8/2009 |
| KR | 10-2007-0082519 | 8/2007 |
| KR | 10-2008-0104935 | 12/2008 |
| KR | 10-2009-0046179 | 5/2009 |
| KR | 10-2009-0057435 | 6/2009 |

OTHER PUBLICATIONS

Chinese Office Action dated Sep. 30. 2014 for corresponding Chinese Application No. 201010525974.3.

Japanese Office Action dated Sep. 9, 2014 for corresponding Japanese Application No. 2010-247373.

* cited by examiner

IMAGE SENSORS HAVING VARIABLE VOLTAGE-CURRENT CHARACTERISTICS AND METHODS OF OPERATING THE SAME

CROSS-REFERENCE TO RELATED APPLICATION

This application claims priority under 35 U.S.C. §119 to Korean Patent Application No. 10-2009-0108660, filed on Nov. 11, 2009, in the Korean Intellectual Property Office (KIPO), the entire contents of which is incorporated herein in by reference.

BACKGROUND

1. Field

Example embodiments relate to image sensors, and more particularly, to image sensors including photo sensors, the voltage-current characteristics of the photo sensors varying according to the wavelength and/or amount of incident light, and methods of operating the image sensors.

2. Description of the Related Art

Image sensors are devices and/or electronic components that may sense information of an object and transform the information into an electrical image signal. Image sensors may be categorized as charge-coupled device (CCD) image sensors or complementary metal oxide semiconductor (CMOS) image sensors. CCD image sensors may use a plurality of MOS capacitors including photoactive regions. If an appropriate voltage is applied sequentially to gates of the MOS capacitors, then signal charges of respective pixels may be sequentially transferred to adjacent MOS capacitors. Photogenerated charge may be transferred across the capacitors to a charge amplifier and converted to a voltage. CMOS image sensors may use a plurality of transistors for a plurality of pixels. Charge carriers may be generated in a photo diode irradiated by light. The charge carriers may be converted into a voltage and the voltage may be output.

SUMMARY

Example embodiments may provide image sensors including at least one photo sensor, the voltage-current characteristics of the output of the photo sensor varying according to the energy of incident light. Sensing of the output of the photo sensor may be easy and/or improved, noise may be removed from the output and the resolution of a sensed image may be enhanced. Example embodiments may provide methods of operating the image sensors.

According to example embodiments, an image sensor may include a pixel array having a plurality of pixels, each of the plurality of pixels including a photo sensor, the voltage-current characteristics of which change according to energy of incident light, for generating a sense current determined by the energy of the incident light, a reset unit that is activated to generate a reference current, according to a reset signal for resetting at least one of the plurality of pixels, and a conversion unit for converting the sense current and the reference current into a sense voltage and a reference voltage, respectively. Each of the plurality of pixels may further include a transmission unit that is activated to supply the sense current to the conversion unit, according to a set signal for selecting an output of the photo sensor included in at least one of the plurality of pixels.

According to example embodiments; an image sensor may include a pixel, the pixel including a photo sensor, voltage-current characteristics of the photo sensor variable based on an energy of incident light, the photo sensor configured to generate a sense current based on the voltage-current characteristics, a reset unit configured to generate a reference current based on a reset signal, and a conversion unit configured to convert the sense current into a sense voltage and the reference current into a reference voltage.

Each of the plurality of pixels may further include an amplification unit for generating a sense signal and a reference signal by amplifying the sense voltage and the reference voltage, respectively, and a selection unit that is activated to supply the sense signal and the reference signal to the outside, according to a selection signal for selecting at least one of the plurality of pixels. The image sensor may further include a row driver for supplying the set signal, the reset signal, and the selection signal to each of the plurality of pixels, an optical detection signal generator for generating an optical detection signal based on the difference between the sense signal and the reference signal received from each of the plurality of pixels and an analog-to-digital converter (ADC) for converting the optical detection signal which is an analog signal into a digital signal.

The optical detection signal generator may include a conversion transistor for converting the sense signal and the reference signal into a sense voltage signal and a reference voltage signal, respectively, a sampling circuit for generating a reference output signal by sampling the reference voltage signal when a reset sampling signal is activated, and for generating a sense output signal by sampling the sense voltage signal when a set sampling signal is activated and an amplifier for generating the optical detection signal by amplifying the difference between the reference output signal and the sense output signal input thereto. The optical detection signal generator may further include a latch for latching the optical detection signal generated by the amplifier. At least two pixels of the plurality of pixels may share at least one selected from the reset unit, the conversion unit, the amplification unit, and the selection unit.

Each of the plurality of pixels further may include a selection unit that is activated to apply the sense voltage and the reference voltage as a sense signal and a reference signal to the outside, respectively, according to a selection signal for selecting at least one of the plurality of pixels. The image sensor may further include a row driver for supplying the set signal, the reset signal, and the selection signal to each of the plurality of pixels, an optical detection signal generator for generating an optical detection signal based on the difference between the sense signal and the reference signal received from each of the plurality of pixels and an analog-to-digital converter (ADC) for converting the optical detection signal which is an analog signal into a digital signal. The optical detection signal generator may include a sampling circuit for generating a reference output signal by sampling the reference signal when a reset sampling signal is activated, and for generating a sense output signal by sampling the sense signal when a set sampling signal is activated, and an amplifier for generating the optical detection signal by amplifying the difference between the reference output signal and the sense output signal input thereto.

At least two pixels of the plurality of pixels may share at least one selected from the reset unit, and the conversion unit. The conversion unit may include a switch that is turned on according to an output of the transmission unit or the reset unit. The conversion unit may include a switch that is turned on by a bias voltage applied from the outside. The photo sensor may include an oxide transistor or an oxide diode, the voltage-current characteristics of which change according to the amounts or wavelengths of the incident light. The oxide transistor or the oxide diode may include a metal oxide selected from the group consisting of ZnO and TiO$_2$.

According to example embodiments, an image sensor may include a pixel array having a plurality of pixels, wherein each of the plurality of pixels includes a photo sensor, the voltage-current characteristics of which change according to energy of incident light, for generating a sense current determined by the energy of the incident light, and a selection unit that is activated to supply the sense current as a sense signal to the outside, according to a selection signal for selecting at least one of the plurality of pixels.

According to example embodiments, an image sensor may include a pixel, the pixel including a photo sensor, voltage-current characteristics of the photo sensor variable based on an energy of incident light, the photo sensor configured to generate a sense current based on the voltage-current characteristics, and a selection unit configured to output the sense current as a sense signal based on a selection signal.

Each of the plurality of pixels may further include a reset unit that is activated to generate a reference current, according to a reset signal for resetting at least one of the plurality of pixels, the selection unit supplying the sense current or the reference current as the sense signal or a reference signal to the outside. Each of the plurality of pixels may further include a transmission unit that is activated to supply the sense current to the selection unit, according to a set signal for selecting an output of the photo sensor included in at least one of the plurality of pixels.

According to example embodiments, in a method of operating an image sensor that includes a pixel array having a plurality of pixels, each of the plurality of pixels including a photo sensor, the voltage-current characteristics of which change according to energy of incident light, the method may include generating a sense current, which is determined by the energy of the incident light, in each of the plurality of pixels and generating a reference current in each of the plurality of pixels, according to a reset signal for resetting at least one of the plurality of pixels.

According to example embodiments, a method of operating an image sensor may include generating a sense current in a photo sensor of a pixel based on an energy of light incident onto the photo sensor, voltage-current characteristics of the photo sensor variable based on the energy of the incident light; and generating a reference current in the pixel based on a reset signal.

BRIEF DESCRIPTION OF THE DRAWINGS

Example embodiments will be more clearly understood from the following brief description taken in conjunction with the accompanying drawings. FIGS. 1-16 represent non-limiting, example embodiments as described herein.

FIG. 1 is a block diagram of an image sensor according to example embodiments;

FIG. 2 is a cross-sectional diagram illustrating a photo sensor included in pixels of the image sensor of FIG. 1 according to an example embodiments;

FIG. 3 is a graph of current $I_{DS}$ (A) as a function of voltage Vgs (V) illustrating voltage-current characteristics of the photo sensor of FIG. 2 for three amounts of incident light according to example embodiments;

FIG. 4 is a graph of current $I_{DS}$ (A) as a function of voltage Vgs (V) illustrating voltage-current characteristics of the photo sensor of FIG. 2 for three spectrums of incident light according to example embodiments;

FIG. 6 is a circuit diagram of an image sensor including pixels as illustrated in FIG. 5A according to example embodiments;

FIG. 7 is a circuit diagram illustrating a pixel, an optical detection signal generator and an analog-to-digital converter (ADC) included in the image sensor of FIG. 6 according to example embodiments;

FIG. 8 is a timing diagram illustrating operation of the pixel, the optical detection signal generator and the ADC of FIG. 7 according to example embodiments;

FIG. 9 is a circuit diagram of an image sensor according to example embodiments;

FIG. 11 is a circuit diagram illustrating the pixel of FIG. 10A, an optical detection signal generator and an ADC of an image sensor according to example embodiments;

FIG. 13 is a circuit diagram illustrating the pixel of FIG. 12A, an optical detection signal generator and an ADC of an image sensor according to example embodiments;

FIG. 15 is a circuit diagram of the pixel of FIG. 14A, an optical detection signal generator and an ADC of an image sensor according to example embodiments; and FIG. 16 is a block diagram illustrating a processor-based system including an image sensor according to example embodiments.

Figure 1:
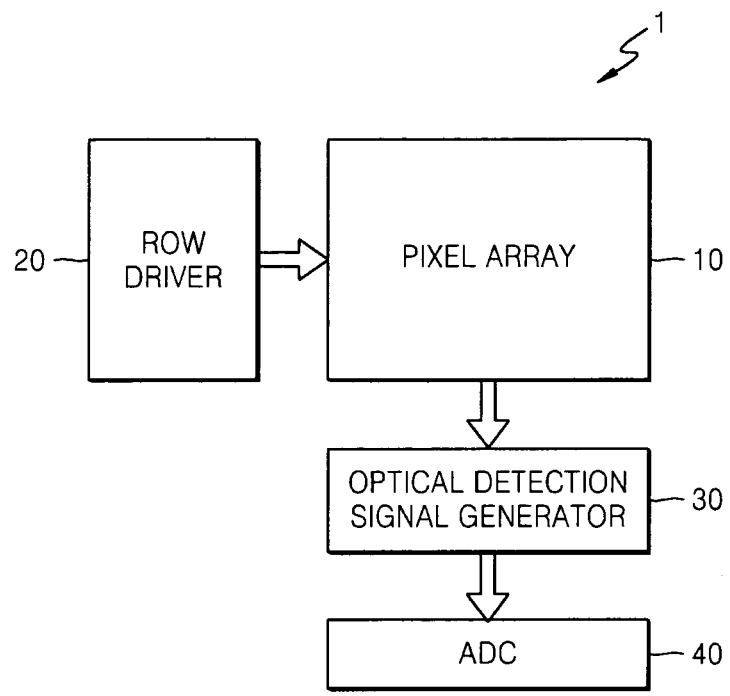

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of an image sensor according to example embodiments. Referring to FIG. 1, an image sensor 1 may include a pixel array 10, a row driver 20, an optical detection signal generator 30 and an analog-to-digital converter (ADC) 40. Although for convenience of explanation, FIG. 1 illustrates an image sensor 1 including four blocks, the image sensor 1 may further include other blocks (e.g., a row decoder, a column decoder, a column driver, and/or an image processor). The pixel array 10 may include a plurality of pixels (not shown). Each of the pixels may receive light, generate a signal from the light and then output the signal. Each of the pixels may include a photo sensor (not shown). The voltage-current characteristics of the photo sensor may vary according to the energy of incident light.

The row driver 20 may supply a plurality of signals to the pixel array 10 in order to drive the pixels of the pixel array 10. The optical detection signal generator 30 may generate an optical detection signal based on signals received from the pixels. The ADC 40 may convert the optical detection signal (analog signal) generated by the optical detection signal generator 30 into a digital signal. The digital signal output from the ADC 40 may be supplied to an image processor (not shown) and the image processor may generate a digital image by processing the digital signal.

Figure 2:
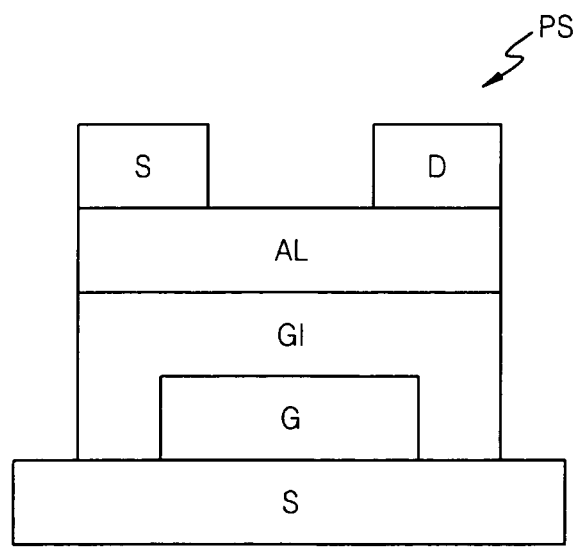

FIG. 2 is a cross-sectional diagram illustrating a photo sensor PS included in pixels, for example, pixels of the pixel array 10 of the image sensor 1 of FIG. 1 according to example embodiments. Referring to FIG. 2, the photo sensor PS may sense incident light by generating current according to the incident light. The photo sensor PS may be embodied as, for example, a thin film transistor (TFT). Although the photo sensor PS is embodied as a TFT in FIG. 2, example embodiments are not limited thereto and the photo sensor PS may be embodied as, for example, a diode.

The photo sensor PS may include a substrate S, a gate electrode G, a gate insulating layer GI, an active layer AL, a source electrode S, and a drain electrode D. The substrate S may be, for example, a glass substrate. The gate electrode G may include, for example, a conductive material and may be disposed on the substrate S. The gate insulating layer GI may include, for example, an insulating material. The gate insulating layer GI may be on the substrate S and may cover at least a part of the gate electrode G. The active layer AL may be on the gate insulating layer GI. The source electrode S and the drain electrode D may be on the active layer AL and may be separated from each other. When about a threshold voltage is applied to the gate electrode G, a channel may be formed in the active layer AL between the source electrode S and the drain electrode D. A current may flow between the source electrode S and the drain electrode D.

The voltage-current characteristics of a photo sensor PS may vary according to the energy of incident light. For example, the active layer AL may include a material with a variable voltage-current characteristic. The voltage-current characteristic may change according to the energy of incident light. The material of the active layer AL may be, for example, a metal oxide (e.g., ZnO and/or $TiO_2$). The photo sensor PS may be an oxide semiconductor transistor. Although example embodiments including an active layer AL are described as including ZnO as a material, example embodiments are not limited thereto, and the photo sensor PS may include any active layer material other than ZnO, where the voltage-current characteristics of the material vary according to the energy of incident light.

Figure 3:
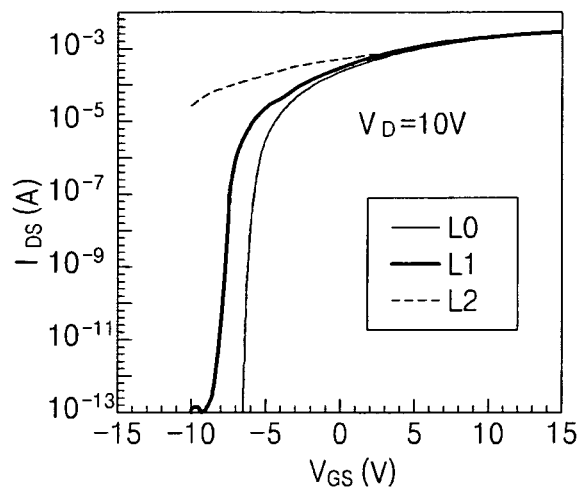

FIG. 3 is a graph of current $I_{DS}$ (A) as a function of voltage Vgs (V) illustrating voltage-current characteristics of the photo sensor PS of FIG. 2 for three amounts of incident light according to example embodiments. In FIG. 3, the x-axis may denote voltage $V_{GS}$ in volts between the gate electrode G and the source electrode S. The y-axis may denote current $I_{DS}$ in amperes flowing between the drain electrode D and the source electrode S. Referring to FIG. 3, if a drain voltage $V_D$ applied to the drain electrode D is 10V, curves illustrating voltage-current characteristics of the photo sensor PS may be different according to the amount of incident light. For example, FIG. 3 illustrates voltage-current characteristics corresponding to three amounts of incident light L0, L1 and L2, where L0<L1<L2. FIG. 3 may illustrate that for a same applied voltage $V_{GS}$, the greater the amount of the incident light, the greater the amount of current $I_{DS}$ flowing between the drain electrode D and the source electrode S on the photo sensor PS.

Figure 4:
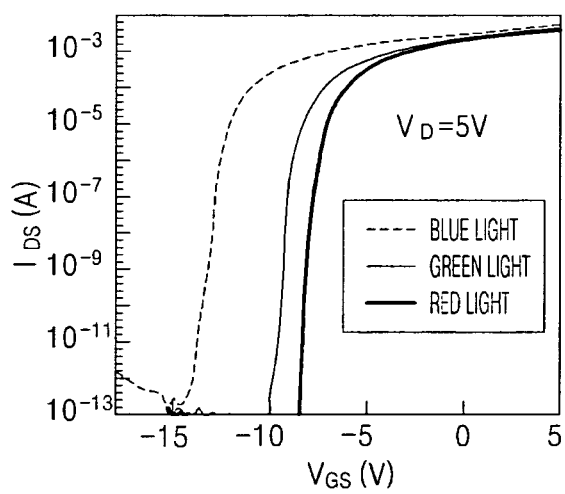

FIG. 4 is a graph of current $I_{DS}$ (A) as a function of voltage Vgs (V) illustrating voltage-current characteristics of the photo sensor PS of FIG. 2 for three spectrums of incident light according to example embodiments. In FIG. 4, the x-axis may denote voltage $V_{GS}$ in volts between the gate electrode G and the source electrode S. The y-axis may denote current $I_{DS}$ in amperes flowing between the drain electrode D and the source electrode S. Referring to FIG. 4, if a drain voltage $V_D$ applied to the drain electrode D is 5V, curves illustrating voltage-current characteristics of the photo sensor PS may be different according to different wavelengths of incident light. FIG. 4 may illustrate voltage-current characteristics for wavelengths of incident light corresponding to red, blue and green light. FIG. 4 may illustrate that for a same applied voltage $V_{GS}$, the shorter the wavelength of the incident light (e.g., the greater the energy), the greater the amount of current $I_{DS}$ flowing between the drain electrode D and the source electrode S of the photo sensor PS. When the voltage-current characteristics of the photo sensor PS changes according to the wavelength of incident light, an image sensor may detect the wavelength of the incident light by analyzing the voltage-current characteristics of the photo sensor PS and may sense red, green, and blue lights (RGB) with a single pixel, without the inclusion of color filters.

A conventional CMOS image sensor may use a MOS transistor in order to sense incident light. In the MOS transistor, a gate insulating layer and a gate electrode may be sequentially disposed on an amorphous or polycrystalline silicon substrate. A source region and a drain region may be disposed at different ends of the gate electrode on the silicon substrate. If a threshold voltage or higher is applied to the gate electrode, a channel may be formed in the silicon substrate between the source region and the drain region. The voltage-current characteristics of the silicon substrate do not change according to incident light. A conventional CMOS image sensor may receive incident light, store electrons generated by current flowing through the MOS transistor in a capacitor, and then measure the intensity of the incident light according to the voltage of the capacitor.

According to example embodiments, a voltage-current characteristic of the photo sensor PS may vary according to the energy received by the photo sensor PS from incident light. For example, the amount of received incident light and/or the wavelength of the received incident light as illustrated in FIGS. 3 and 4. According to example embodiments, it may be difficult to measure the intensity of incident light by measuring the voltage of a capacitor in which electrons are stored. Accordingly, a pixel scheme for easily detecting current generated by the photo sensor PS may be required. A structure of pixels of an image sensor including the photo sensor PS according to example embodiments, in order to detect current determined according to the energy of incident light, will now be described.

Figure 5A:
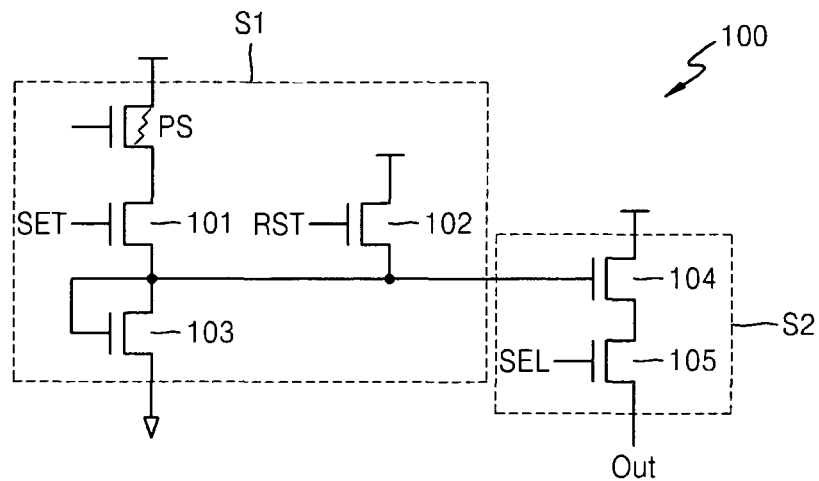
FIGS. 5A-5C are circuit diagrams of pixels that may be included in the image sensor of FIG. 1 according to example embodiments.
Figure 5B:
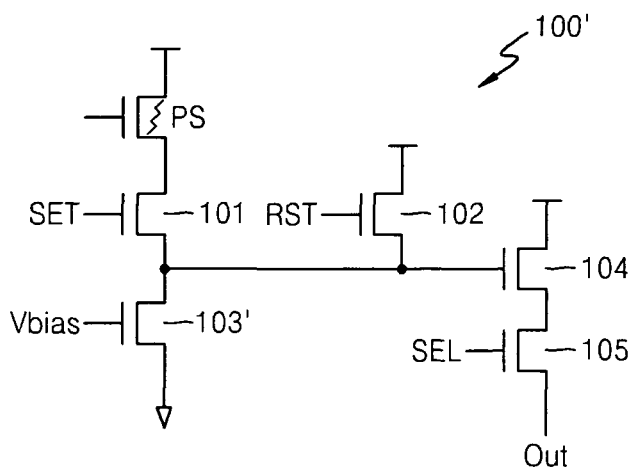
Figure 5C:
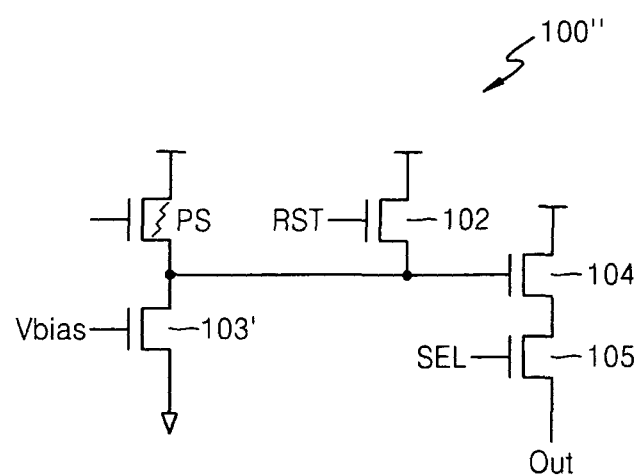

FIGS. 5A-5C are circuit diagrams of pixels 100, 100', and 100", respectively. Pixels 100, 100', and/or 100" may be included, for example, in the pixel array 10 of the image sensor 1 of FIG. 1 according to example embodiments. Referring to FIG. 5A, the pixel 100 may include a photo sensor PS, a transmission unit 101, a reset unit 102, a conversion unit 103, an amplification unit 104 and a selection unit 105. For example, the transmission unit 101, the reset unit 102, conversion unit 103, the amplification unit 104 and the selection unit 105 may be in the same layer and the photo sensor PS may be on the layer. An area that a pixel 100 occupies in the image sensor 1 may be reduced.

The voltage-current characteristics of the photo sensor PS may vary according to the energy of light incident on the photo sensor PS. The photo sensor PS may generate a sense current determined by the energy of the incident light. For example, the photo sensor PS may include a photo sensor transistor. Hereinafter, example embodiments are described with reference to a photo sensor PS embodied as a photo sensor transistor PS, although example embodiments are not so limited. A drain of the photo sensor transistor PS may be connected to a supply voltage source. Upon application of about a threshold voltage to a gate of the photo sensor transistor PS a channel may be generated between the drain and source of the photo sensor transistor PS. A sense current may flow through the channel. The amount of the sense current flowing through the channel between the drain and source may be determined by the wavelengths or amounts of incident light.

The transmission unit 101 may be activated to output the sense current generated by the photo sensor PS in response to a set signal SET received from, for example, the row driver 20 of FIG. 1. The set signal SET may be used to select an output of the photo sensor PS included in at least one of the pixels of the pixel array 10. If a threshold voltage of the photo sensor transistor PS is, for example, less than about 0V, a sense current generated by the photo sensor PS may be selectively output by controlling the set signal SET to be supplied to the transmission unit 101. Although example embodiments are described with respect to a ground voltage (e.g., 0V), one having ordinary skill in the art will understand that a relationship between a threshold voltage and a supply voltage (e.g., ground) may determine, for example, a leakage current and a requirement for selective output of a sense current.

The transmission unit 101 may include a transmission transistor connected in series to the photo sensor transistor PS. The transmission unit 101 may be embodied as, for example, a transmission transistor 101, although example embodiments are not so limited. The set signal SET may be supplied to a gate of the transmission transistor 101 and when the set signal SET is "ON", the transmission transistor 101 may be turned on to output the sense current generated by the photo sensor PS as a transmission current.

The reset unit 102 may be activated to output a reference current according to a reset signal RST received from the row driver 20. The reset signal RST may be used to reset at least one of the pixels included in the pixel array 10. The sense current generated by the photo sensor PS may vary according to PVT (process, voltage, temperature) variables. The reference voltage output from the reset unit 102 may also vary according to the PVT variables. In the current embodiment, the pixel 100 may include the reset unit 102 and may compensate for a change in the sense current, caused by the PVT variables, using the reset unit 102. Noise in an output Out of the pixel 100 may be reduced.

For example, the reset unit 102 may include a reset transistor. The reset unit 102 may be embodied as, for example, a reset transistor 102, although example embodiments are not so limited. A drain of the reset transistor 102 may be connected to the supply voltage source and the reset signal RST may be supplied to a gate of the reset transistor 102. When the reset signal RST is "ON", the reset transistor 102 may be turned on to output the reference current.

The conversion unit 103 may convert the sense current received from the transmission unit 101 and/or the reference current received from the reset transistor 102 into a sense voltage and/or a reference voltage, respectively. For example, the conversion unit 103 may include a conversion transistor. The conversion unit 103 may be embodied as, for example, a conversion transistor 103, although example embodiments are not so limited. A source of the conversion transistor 103 may be connected to, for example, a ground voltage source. A drain and gate of the conversion transistor 103 may be connected to sources of the transmission transistor 101 and the reset transistor 102. The conversion transistor 103 may have a diode-connected structure in which the drain and gate thereof are connected to each other. An additional control signal may not be supplied to turn on the conversion transistor 103.

The amplification unit 104 may generate a sense signal and/or a reference signal based on the sense voltage and/or the reference voltage, respectively, generated by the conversion unit 103. For example, the amplification unit 104 may include an amplification transistor. The amplification unit 104 may be embodied as, for example, an amplification transistor 104, although example embodiments are not so limited. A drain of the amplification transistor 104 may be connected to the supply voltage source. The sense voltage and/or the reference voltage generated by the conversion unit 103 may be supplied to a gate of the amplification transistor 104. If the sense voltage and/or the reference voltage generated by the conversion unit 103 are about a threshold voltage of the gate of the amplification transistor 104, the amplification transistor 104 may be turned on, and a current may flow between a drain and source of the amplification transistor 104. The current flowing between the drain and source of the amplification transistor 104 may be output as the sense signal and/or the reference signal, respectively.

The selection unit 105 may be activated to supply the sense signal and/or the reference signal generated by the amplification unit 104 to the optical detection signal generator 30 of FIG. 1 according to a selection signal SEL received from the row driver 20. The selection signal SEL may be used to select at least one of the pixels included in the pixel array 10. For example, the selection unit 105 may include a selection transistor. The selection unit 105 may be embodied as, for example, a selection transistor 105, although example embodiments are not so limited. The selection transistor 105 may be connected in series to the amplification transistor 104 and the selection signal SEL may be supplied to the gate of the selection transistor 105. When the selection signal SEL is "ON", the selection transistor 105 may be turned on to supply the sense signal and/or the reference signal to the optical detection signal generator 30.

According to example embodiments, the pixel 100 may include the photo sensor PS, the transmission unit 101, the reset unit 102, the conversion unit 103, the amplification unit 104 and the selection unit 105, and may generate an output signal by sensing incident light according to, for example, two operations. The pixel 100 may include a first sense unit S1 and a second sense unit S2. The first sense unit S1 may include the photo sensor PS, the transmission unit 101, the reset unit 102 and the conversion unit 103. The second sense unit S2 may include the amplification unit 104 and the selection unit 105. The first sense unit S1 may sense incident light and generate, a first output signal from the incident light. The second sense unit S2 may generate a second output signal by amplifying the first output signal. It may be possible to prevent and/or reduce noise generated in the first sense unit S1 from being supplied to the second sense unit S2. A signal to noise ratio (SNR) may be improved and a wider operational range may be secured.

Referring to FIG. 5B, the pixel 100' may include a photo sensor PS, a transmission unit 101, a reset unit 102, a conversion unit 103', an amplification unit 104 and a selection unit 105. The pixel 100' according to example embodiments may be a modification to the pixel 100 of FIG. 5A. Elements of the pixel 100' that are the same as those of the pixel 100 may not be described again.

According to example embodiments, a conversion unit 103' may convert a sense current received from the transmission unit 101 and/or a reference current received from the reset unit 102 into a sense voltage and/or a reference voltage, respectively. For example, the conversion unit 103' may include a conversion transistor. The conversion unit 103' may be embodied as, for example, a conversion transistor 103'. A source of the conversion transistor 103' may be connected to a ground voltage source and a drain of the conversion transistor 103 may be connected to output terminals of the transmission unit 101 and the reset unit 102. A bias voltage $V_{bias}$ may be applied to a gate of the conversion transistor 103'. The conversion unit 103' may be activated by the bias voltage $V_{bias}$ applied thereto and offsets in the sense voltage and/or the reference voltage may be compensated for by adjusting the bias voltage $V_{bias}$. A voltage applied to the amplification unit 104 may be controlled by adjusting the bias voltage $V_{bias}$.

Referring to FIG. 5C, the pixel 100" may include a photo sensor PS, a reset unit 102, a conversion unit 103', an amplification unit 104 and a selection unit 105. The pixel 100" according to the current embodiment may be a modification of the pixel 100 of FIG. 5A and/or the pixel 100' of FIG. 5B and elements of the pixel 100" that are the same as those of the pixel 100 or the pixel 100' may not be described again.

According to example embodiments, the pixel 100" may not include a transmission unit. If, for example, a threshold voltage of a photo sensor transistor included in the photo sensor PS is greater than, for example, about 0V, the pixel 100" may not include a transmission unit. The conversion unit 103' may convert a sense current received from the photo sensor PS and/or a reference current received from the reset unit 102 into a sense voltage and/or a reference voltage, respectively. According to example embodiments, a transmission unit may not be included in the pixel 100" and a size of the pixel 100" may be reduced. The pixel 100" may include a conversion unit 103 of FIG. 5A instead of a conversion unit 103'.

Figure 6:
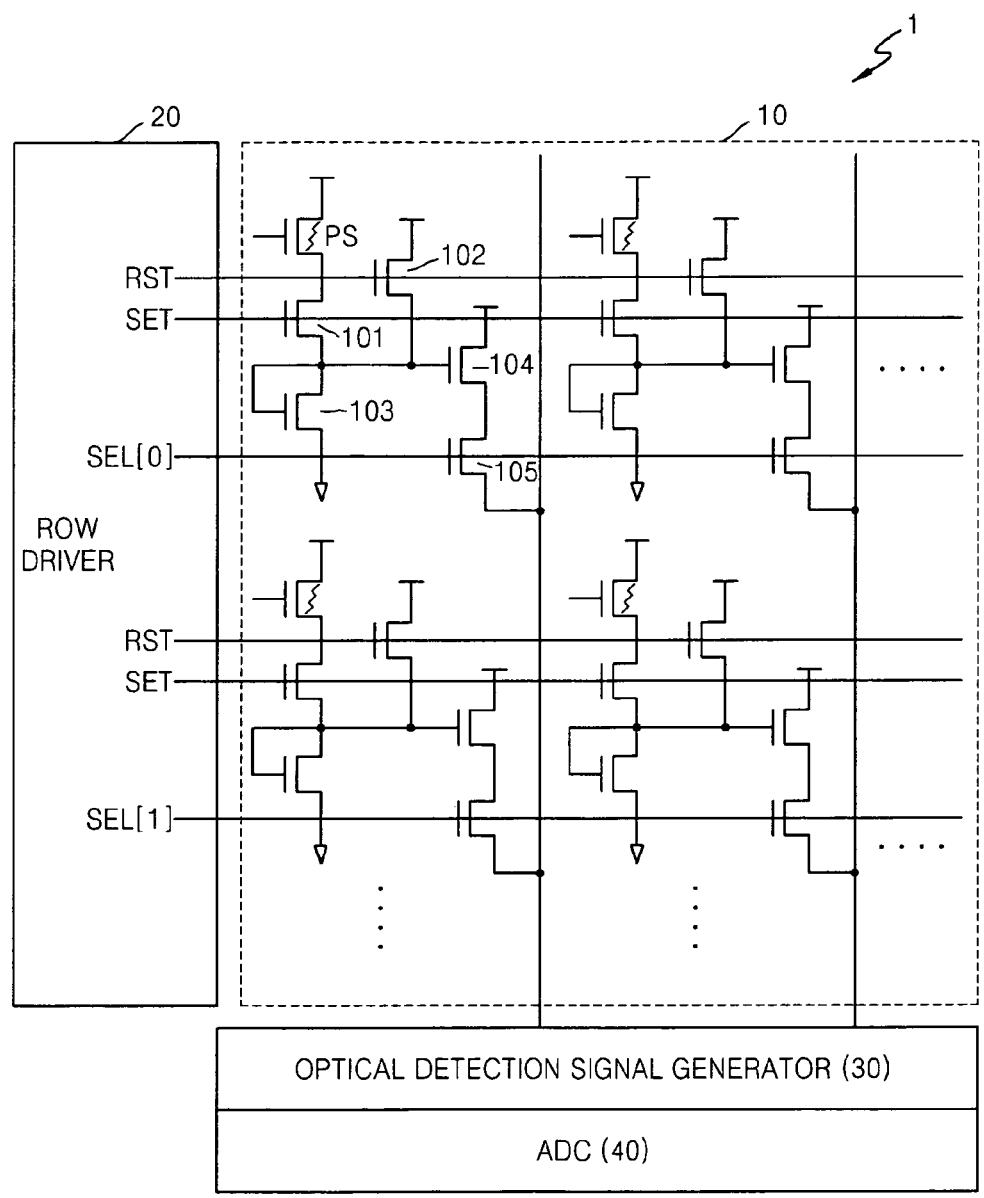

FIG. 6 is a circuit diagram of an image sensor 1 including a plurality of pixels 100 as illustrated in FIG. 5A according to example embodiments. Referring to FIG. 6, an image sensor 1 may include a pixel array 10, a row driver 20, an optical detection signal generator 30 and an ADC 40. The pixel array 10 may include a plurality of pixels 100. The pixel array 10 may include a plurality of driving signal lines connected to the row driver 20 and a plurality of output signal lines connected to the optical detection signal generator 30. In the pixel array 10, the plurality of pixels 100 may be at intersections of the plurality of driving signal lines and the plurality of output signal lines, respectively. The plurality of driving signal lines may include set signal lines, reset signal lines, and selection signal lines in a plurality of rows. The plurality of output signal lines may include output signal lines in a plurality of columns.

The row driver 20 may supply a set signal SET, a reset signal RST and a selection signal SEL to each of the plurality of pixels 100 via one of the set signal lines, one of the reset signal lines, and one of the selection signal lines, respectively. The transmission unit 101, the reset unit 102, and the selection unit 105 included in each of the pixels 100 may be activated according to the set signal SET, the reset signal RST and the selection signal SEL received from the row driver 20, respectively. A plurality of the pixels 100 in the same row may be activated simultaneously. An output signal of the selection unit 105 of each of the pixels 100 may be supplied to the optical detection signal generator 30 via one of the output signal lines.

The image sensor 1 of FIG. 6 may include a pixel array 10 including a plurality of pixels 100 (e.g., the pixel 100 shown FIG. 5A), a plurality of pixels 100' (e.g., the pixel 100' as shown in FIG. 5B) and/or a plurality of pixels 100" (e.g., the pixel 100" as illustrated in FIG. 5C) and/or may include other pixels.

Figure 7:
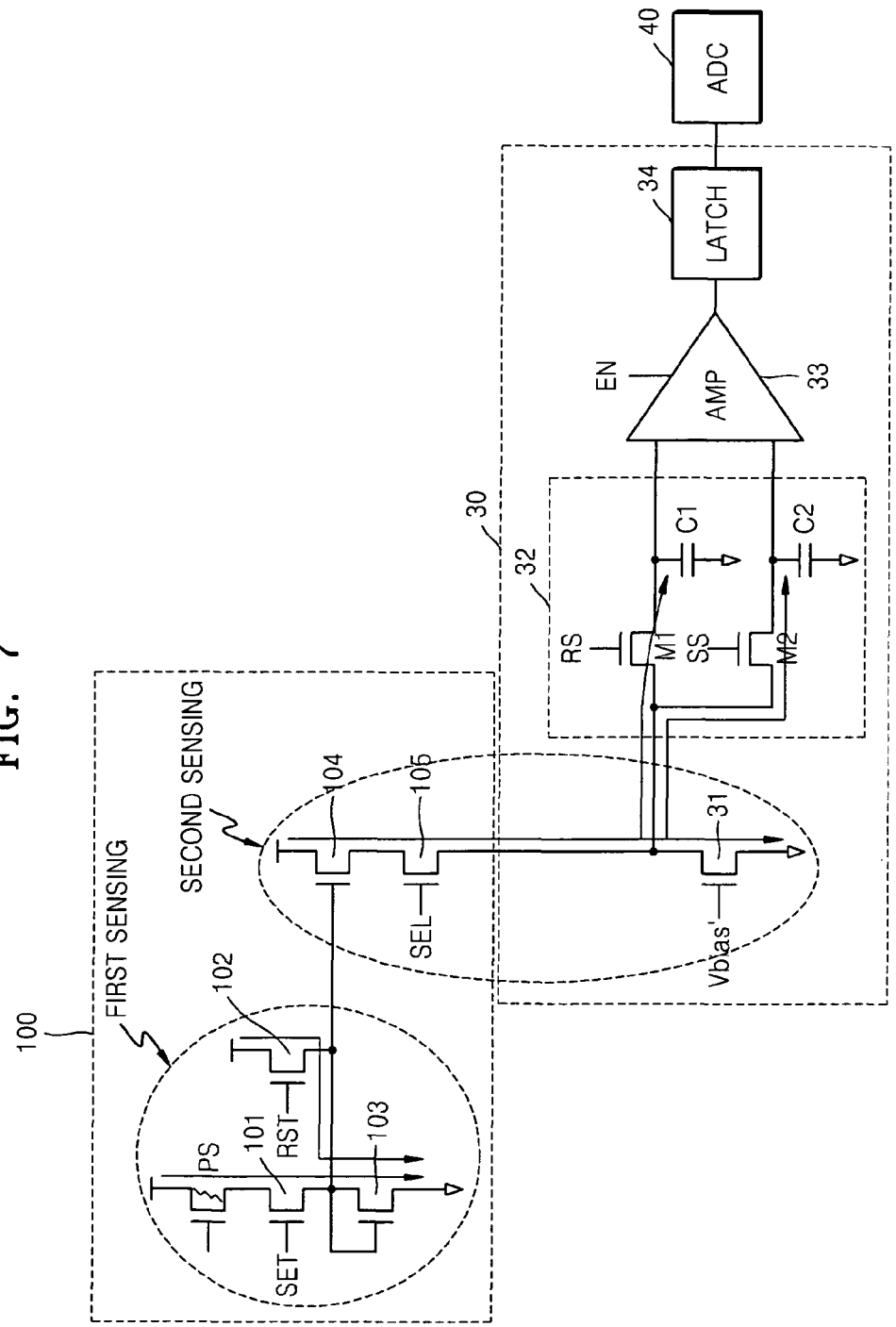

FIG. 7 is a circuit diagram illustrating a pixel 100, an optical detection signal generator 30 and an ADC 40 included in an image sensor 1 of FIG. 6 according to example embodiments. The optical detection signal generator 30 may include a conversion transistor 31, a sampling circuit 32, an amplifier 33 and a latch 34. According to example embodiments, the optical detection signal generator 30 may be embodied as, for example, a correlated double sampling (CDS) circuit and may be capable of removing low-frequency noise.

The conversion transistor 31 may convert a sense signal and/or a reference signal received from the selection unit 105 of the pixel 100 into a sense voltage signal and/or a reference voltage signal, respectively. A bias voltage $V_{bias}'$ may be applied to a gate of the conversion transistor 31. Offsets in the sense voltage signal and/or the reference voltage signal may be compensated for by controlling the bias voltage $V_{bias}'$. The sampling circuit 32 may include first and second switches M1 and M2 and first and second capacitors C1 and C2.

The first switch M1 may be activated according to a reset sampling signal RS and may charge the first capacitor C1 according to the reference voltage signal. The second switch M2 may be activated according to a set sampling signal SS and may charge the second capacitor C2 according to the sense voltage signal. The amplifier 33 may be enabled according to an enable signal EN and may output an optical detection signal by amplifying the difference between voltages of the first and second capacitors C1 and C2 input thereto. The latch 34 may latch the optical detection signal received from the amplifier 33.

Figure 8:
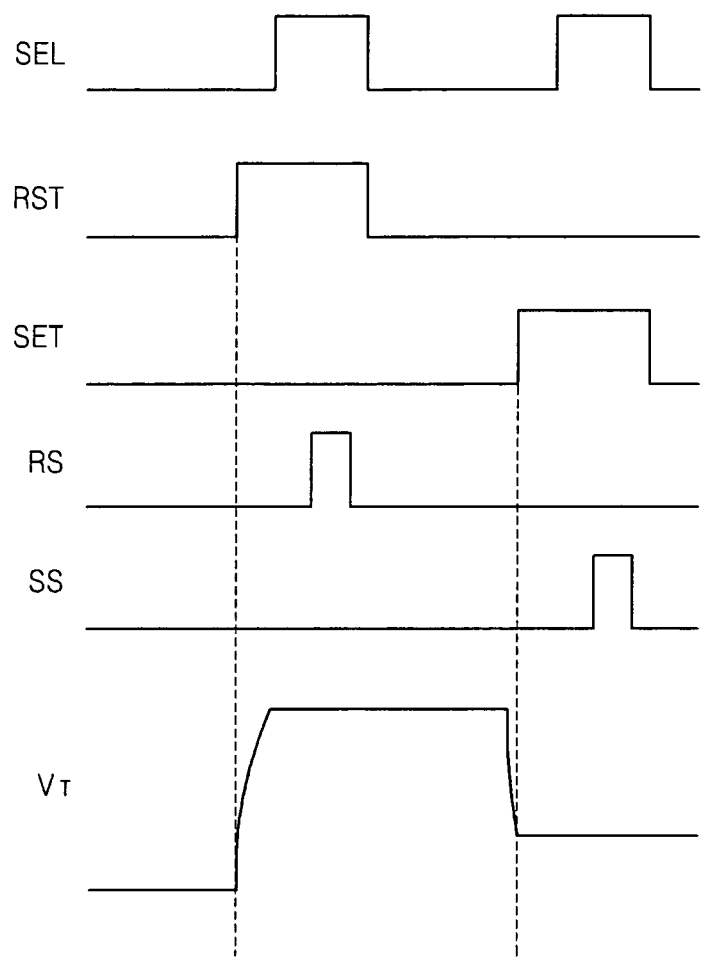

FIG. 8 is a timing diagram illustrating operation of the pixel 100, the optical detection signal generator 30 and the ADC 40 of FIG. 7 according to example embodiments. Referring to FIGS. 7 and 8, when a reset signal RST is "on" (e.g., the reset signal RST is logic high) the reset unit 102 may be activated to output a reference current and the conversion unit 103 may convert the reference current received from the reset unit 102 into a voltage $V_T$ equal to a reference voltage. The amplification unit 104 may generate a reference signal based on the voltage $V_T$ received from the conversion unit 103. When a selection signal SEL is "on", the selection unit 105 may supply the reference signal generated by the amplification unit 104 to the conversion transistor 31 and the conversion transistor 31 may convert the reference signal into a reference voltage signal. When a reset sampling signal RS is "on", the reference voltage signal may be supplied to the first capacitor C1.

When a set signal SET is "on" the transmission unit 101 may be activated to output a sense current and the conversion unit 103 may convert the sense current received from the transmission unit 101 into a voltage $V_T$ equal to a sense voltage. The amplification unit 104 may generate a sense signal based on the voltage $V_T$ received from the conversion unit 103. When the selection signal SEL is "on" the selection unit 105 may supply the sense signal generated by the amplification unit 104 to the conversion transistor 31 and the conversion transistor 31 may convert the sense signal into a sense voltage signal. When a set sampling signal SS is "on", the sense voltage signal may be supplied to the second capacitor C2. When an enable signal EN is "on", the amplifier 33 may be activated and may generate an optical detection signal by amplifying the difference between voltages of the first capacitor C1 and the second capacitor C2.

Figure 9:
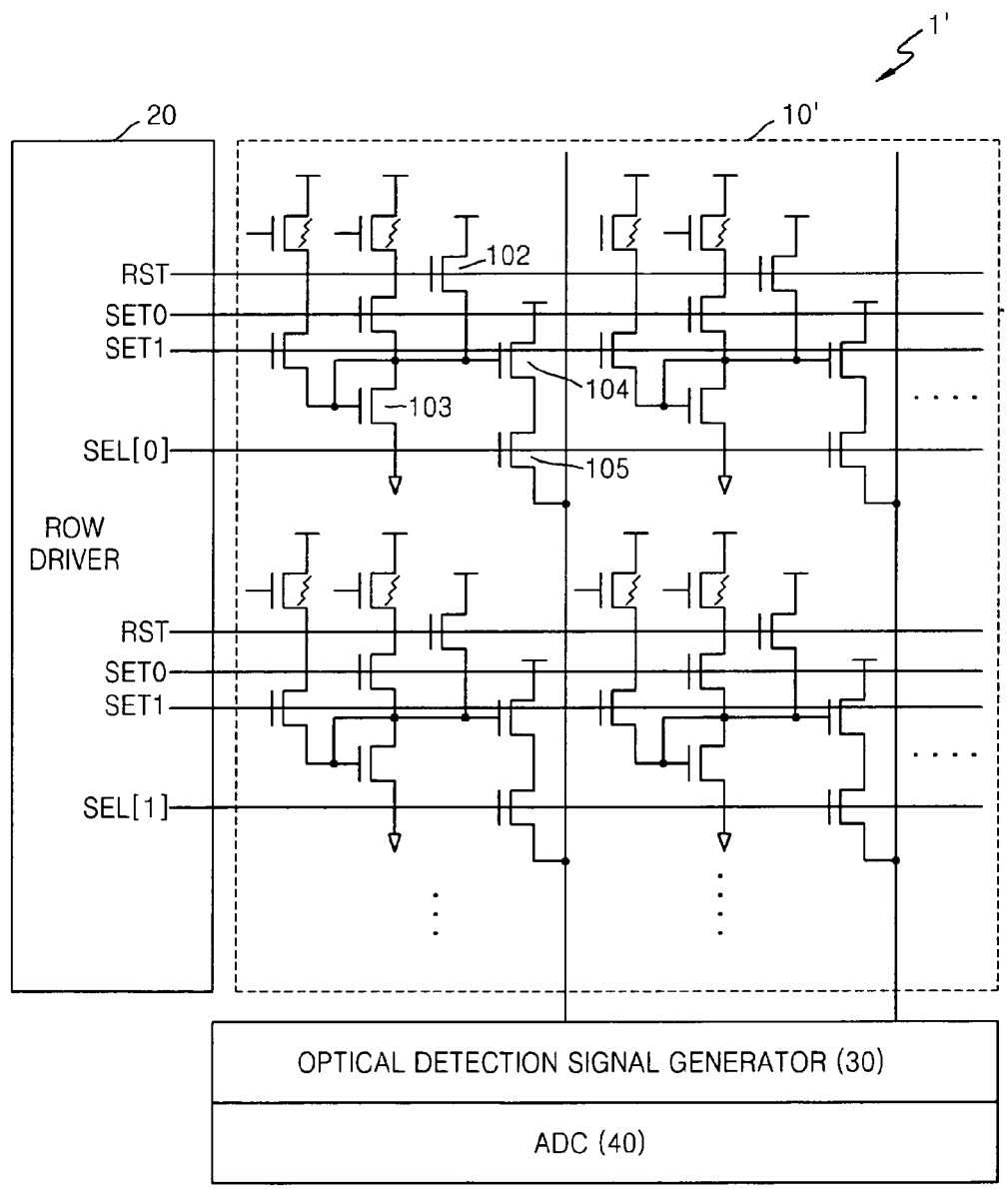

FIG. 9 is a circuit diagram of an image sensor 1' according to example embodiments. Referring to FIG. 9, the image sensor 1' may include a pixel array 10', a row driver 20, an optical detection signal generator 30 and an ADC 40. The image sensor 1' according to the example embodiments may be a modification to the image sensor 1 of FIG. 6 and elements of the image sensor 1' that are the same as those of the image sensor 1 may not be described again. A plurality of pixels included in the pixel array 10' may share at least one of a reset unit 102, a conversion unit 103, an amplification unit 104 and a selection unit 105. Each of the plurality of pixels may sense incident light and may each include, nor example, a photo sensor and a transmission unit. A size of the image sensor 1' may be reduced.

Figure 10A:
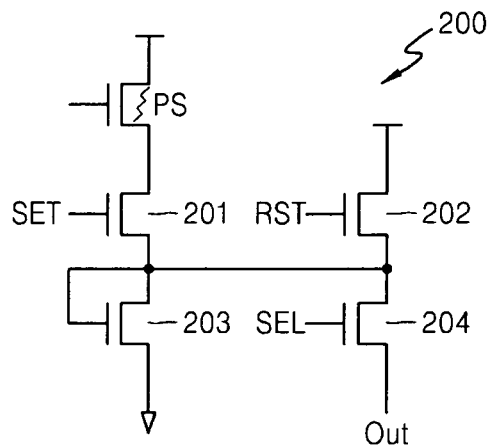
FIGS. 10A-10C are circuit diagrams of pixels that may be included in the image sensor of FIG. 1 according to example embodiments.
Figure 10B:
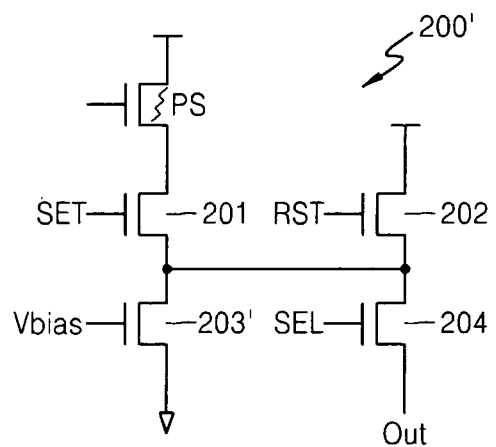
Figure 10C:
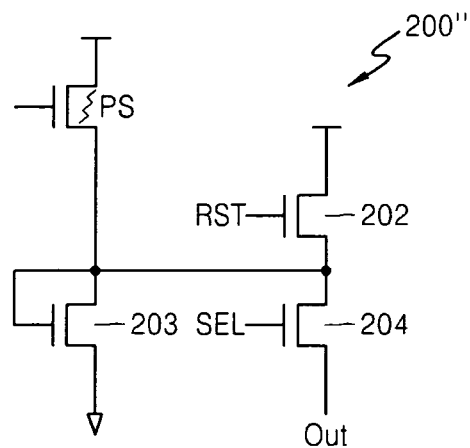

FIGS. 10A-10C are circuit diagrams of pixels 200, 200', and 200", respectively. Pixels 200, 200', and/or 200" may be included, for example, in the pixel array 10 of the image sensor 1 of FIG. 1 according to example embodiments. Referring to FIG. 10A, the pixel 200 may include a photo sensor PS, a transmission unit 201, a reset unit 202, a conversion unit 203 and a selection unit 204. The pixel 200 according to example embodiments may be a modification of the pixel 100 of FIG. 5A and elements of the pixel 200 that are the same as those of the pixel 100 may not be described again. The photo sensor PS may have voltage-current characteristics that vary according to the energy of incident light and may generate a sense current determined by the energy of the incident light.

The transmission unit 201 may be activated to output the sense current generated by the photo sensor PS according to a set signal SET. The reset unit 202 may be activated to output a reference current according to a reset signal RST. The conversion unit 203 may convert the sense current received from the transmission unit 201 and/or the reference current received from the reset unit 202 into a sense voltage and/or a reference voltage, respectively. The selection unit 204 may be activated to supply the sense voltage and/or the reference voltage generated by the conversion unit 203 to the optical detection signal generator 30 according to a selection signal SEL. According to example embodiments, a pixel 200 may not include an amplification unit. The selection unit 204 may directly output the sense voltage and/or the reference voltage received from the conversion unit 203.

Referring to FIG. 10B, the pixel 200' may include a photo sensor PS, a transmission unit 201, a reset unit 202, a conversion unit 203' and a selection unit 204. The pixel 200' according to the current embodiment may be a modification of the pixel 200 of FIG. 10A and elements of the pixel 200' that are the same as those of the pixel 200 may not be described again. According to example embodiments, the conversion unit 203' may convert a sense current received from the transmission unit 201 and/or a reference current received from the reset unit 202 into a sense voltage and/or a reference voltage, respectively. For example, the conversion unit 203' may include a conversion transistor. The conversion unit 203' may be embodied as, for example, a conversion transistor 203', although example embodiments are not so limited.

A source of the conversion transistor 203' may be connected to a ground voltage source and a drain of the conversion transistor 203' may be connected to output terminals of the transmission unit 201 and the reset unit 202. A bias voltage $V_{bias}$ may be applied to a gate of the conversion transistor 203'. The conversion unit 203' may be activated by the bias voltage $V_{bias}$. Offsets in the sense voltage and/or the reference voltage may be compensated for by controlling the bias voltage $V_{bias}$. A voltage that is to be applied to the selection unit 204 may be controlled by controlling the bias voltage $V_{bias}$.

Referring to FIG. 10C, a pixel 200" may include a photo sensor PS, a reset unit 202, a conversion unit 203 and a selection unit 204. The pixel 200" according to example embodiments may be a modification of the pixel 200 of FIG. 10A and elements of the pixel 200" that are the same as those of the pixel 200 may not be described again. According to example embodiments, the pixel 200" may not include a transmission unit. If a threshold voltage of a photo sense transistor included in the photo sensor PS is greater than, for example, about 0V the pixel 200" may not include the transmission unit 201. The conversion unit 203 may convert a sense current received from the photo sensor PS and/or a reference current received from the reset unit 202 into a sense voltage and/or a reference voltage, respectively. According to example embodiments, the pixel 200" may not include the transmission unit 201 and a size of the pixel 200" may be reduced.

Figure 11:
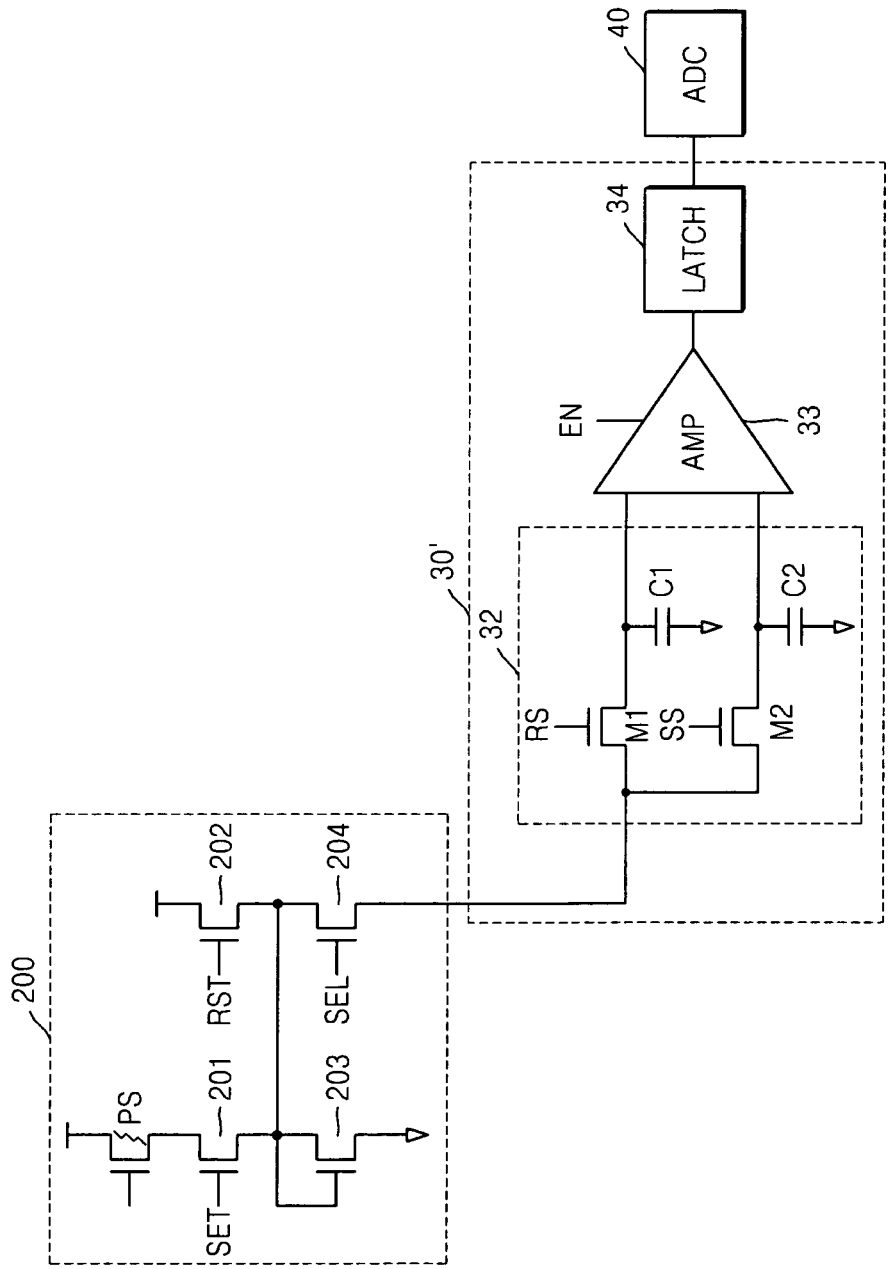

FIG. 11 is a circuit diagram illustrating a pixel 200 of FIG. 10A, an optical detection signal generator 30' and an ADC 40 of an image sensor according to example embodiments. Referring to FIG. 11, the optical detection signal generator 30' may include a sampling circuit 32, an amplifier 33 and a latch 34. The image sensor according to the current embodiment may be a modification of the image sensor 1 of FIG. 7 and elements of the image sensor of FIG. 11 that are the same as those of the image sensor 1 of FIG. 7 may not be described again.

The selection unit 204 of the pixel 200 may output a sense voltage and/or a reference voltage. The optical detection signal generator 30' may not include a conversion transistor for converting an output signal of the pixel 200 into a voltage. The sampling circuit 32 may include first and second switches M1 and M2 and first and second capacitors C1 and C2. The first switch M1 may be activated according to a reset sampling signal RS and may charge the first capacitor C1 according to the reference voltage received from the selection unit 204 of the pixel 200. The second switch M2 may be activated according to a set sampling signal SS and may charge the second capacitor C2 according to the sense voltage received from the selection unit 204 of the pixel 200. The amplifier 33 may be enabled according to an enable signal EN and may output an optical detection signal by amplifying a difference between voltages of the first and second capacitors C1 and C2. The latch 34 may latch the optical detection signal received from the amplifier 33.

The operation of an image sensor according to example embodiments will now be described. When a reset signal RST is "on" the reset unit 202 may be activated to output a reference current and the conversion unit 203 may convert the reference current received from the reset unit 202 into a voltage $V_T$ equal to a reference voltage. When a selection signal SEL is "on", the selection unit 204 may output the voltage $V_T$ equal to the reference voltage received from the conversion unit 203. When a reset sampling signal is "on" the voltage $V_T$ equal to the reference voltage may be supplied to the first capacitor C1.

When a set signal SET is "on" the transmission unit 201 may be activated to output a sense current and the conversion unit 203 may convert the sense current received from the transmission unit 201 into a voltage $V_T$ equal to a sense voltage. When the selection signal SEL is "on" the selection unit 204 may output the voltage $V_T$ equal to the sense voltage received from the conversion unit 203. When a set sampling signal SS is "on" the voltage $V_T$ equal to the sense voltage may be supplied to the second capacitor C2. When an enable signal EN is "on" the amplifier 33 may be activated to generate an optical detection signal by amplifying a difference between voltages of the first capacitor C1 and the second capacitor C2.

Figure 12A:
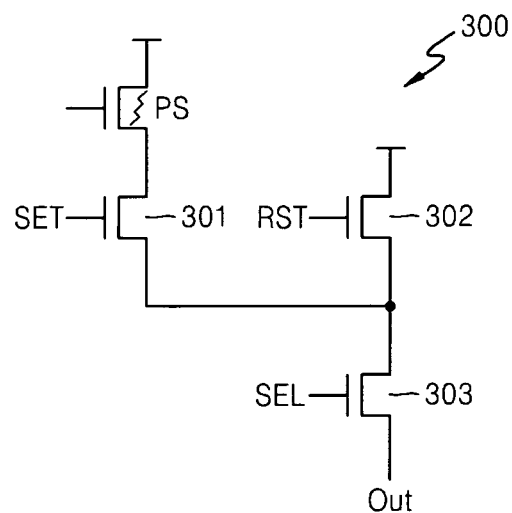
FIGS. 12A and 12B are circuit diagrams of pixels that may be included in the image sensor of FIG. 1 according to example embodiments.
Figure 12B:
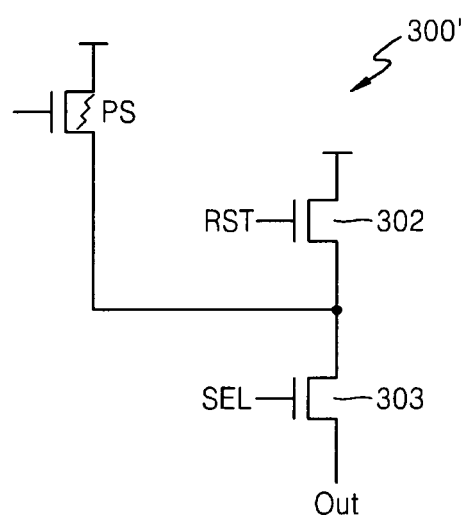

FIGS. 12A and 12B are circuit diagrams of pixels 300 and 300' that may be included in the pixel array 10 of the image sensor of FIG. 1 according to example embodiments. Referring to FIG. 12A, the pixel 300 may include a photo sensor PS, a transmission unit 301, a reset unit 302 and a selection unit 303. The pixel 300 according to example embodiments may be a modification of the pixel 100 of FIG. 5A and elements of the pixel 300 that are the same as those of the pixel 100 may not be described again. The photo sensor PS may have voltage-current characteristics that vary according to the energy of incident light and may generate a sense current determined by the energy of the incident light.

The transmission unit 301 may be activated to output the sense current generated by the photo sensor PS according to a set signal SET. The reset unit 302 may be activated to output a reference current according to a reset signal RST. The selection unit 303 may supply the sense current received from the transmission unit 301 and/or the reference current received from the reset unit 302 to the optical detection signal generator 30 according to a selection signal SEL. The pixel 300 according to example embodiments may not include a conversion unit and/or an amplification unit. The selection unit 303 may output the sense current and/or the reference current directly.

Referring to FIG. 12B, a pixel 300' may include a photo sensor PS, a reset unit 302 and a selection unit 303. The pixel 300' according to the current embodiment may be a modification of the pixel 300 of FIG. 12A and elements of the pixel 300' that are the same as those of the pixel 300 may not be described again. The pixel 300' according to example embodiments may not include a transmission unit. If a threshold voltage of a photo sense transistor included in the photo sensor PS is greater than, for example, about 0V the pixel 300' may not include a transmission unit. According to example embodiments, a size of the pixel 300' may be reduced as compared to, for example, a pixel 300.

Figure 13:
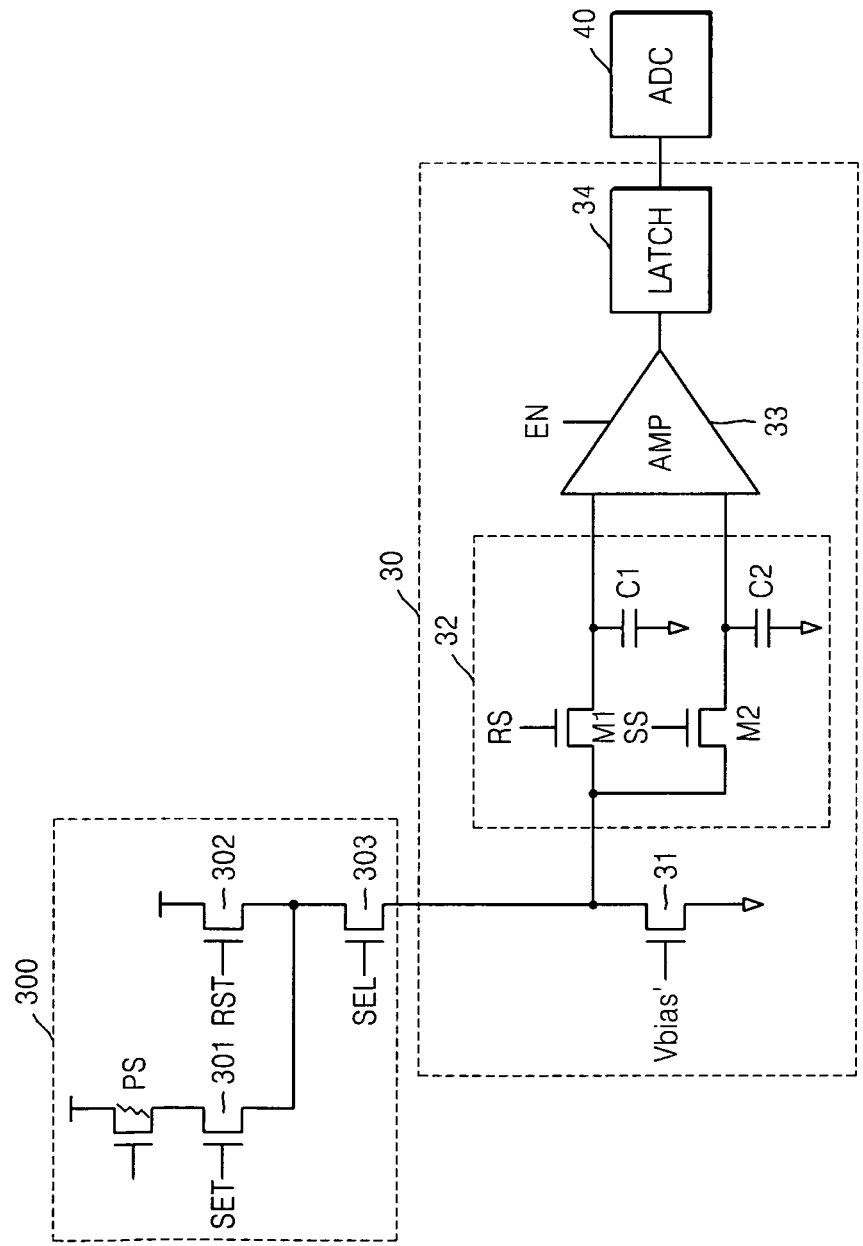

FIG. 13 is a circuit diagram illustrating the pixel 300 of FIG. 12A, an optical detection signal generator 30 and an ADC 40 of an image sensor according to example embodiments. The optical detection signal generator 30 may include a conversion transistor 31, a sampling circuit 32, an amplifier 33 and a latch 34. An image sensor according to example embodiments may be a modification of the image sensor 1 of FIG. 7 and elements of the image sensor of FIG. 13 that are the same as those of the image sensor 1 may not be described again. The conversion transistor 31 may convert a sense current and/or a reference current received from the selection unit 303 of the pixel 300 into a sense voltage signal and/or a reference voltage signal, respectively.

The sampling circuit 32 may include first and second switches M1 and M2 and first and second capacitors C1 and C2. The first switch M1 may be activated according to a reset sampling signal RS and may charge the first capacitor C1 according to the reference voltage signal. The second switch M2 may be activated according to a set sampling signal SS and may charge the second capacitor C2 according to the sense voltage signal. The amplifier 33 may be enabled according to an enable signal EN and output an optical detection signal by amplifying a difference between voltages of the first and second capacitors C1 and C2. The latch 34 may latch the optical detection signal received from the amplifier 33.

The operation of an image sensor according to example embodiments will now be described. When a reset signal RST is "on" the reset unit 302 may be activated to output a reference current. When a selection signal SEL is "on" the selection unit 303 may output the reference current received from the reset unit 302. The conversion transistor 31 may convert the reference current into a reference voltage signal. When a reset sampling signal RS is "on" the reference voltage signal may be supplied to the first capacitor C1.

When a set signal SET is "on" the transmission unit 301 may be activated to output a sense current. When the selection signal SEL is "on" the selection unit 303 may output the sense current received from the transmission unit 301. The conversion transistor 31 may convert the sense current into a sense voltage signal. When the set sampling signal SS is "on" the sense voltage signal may be supplied to the second capacitor C2. When the enable signal EN is "on" the amplifier 33 may be activated and may generate an optical detection signal by amplifying a difference between the voltages of the first and second capacitors C1 and C2 input thereto.

Figure 14A:
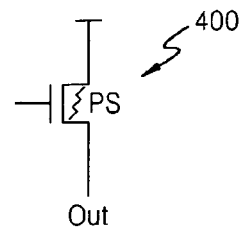
FIGS. 14A and 14B are circuit diagrams of pixels that may be included in the image sensor of FIG. 1 according to example embodiments.
Figure 14B:
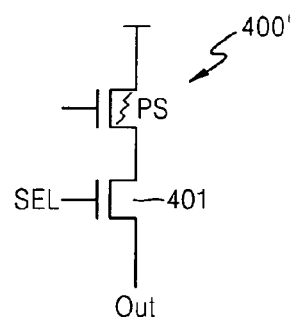

FIGS. 14A and 14B are circuit diagrams of pixels 400 and 400' that may be included in the pixel array 10 of the image sensor 1 of FIG. 1 according to example embodiments. Referring to FIG. 14A, a pixel 400 may include a photo sensor PS with voltage-current characteristics that vary according to the energy of incident light. The photo sensor PS may generate a sense current determined by the energy of the incident light. The photo sensor PS may be substantially the same as the photo sensor PS of the pixel 100 of FIG. 5A and may be described in terms of differences therebetween.

Referring to FIG. 14A, if a first voltage V1 is applied to a gate of the photo sensor PS the photo sensor PS may generate a first sense current. If a second voltage V2 is applied to the gate of the photo sensor PS the photo sensor PS may generate a second sense current. According to example embodiments, because the pixel 400 does not include a reset unit, incident light may be detected by sequentially applying the first and second voltages V1 and V2 to the gate of the photo sensor PS in order to generate the first and second sense currents, and by using a difference between the first and second sense currents. The pixel 400 of the current embodiment may include only the photo sensor PS and the size of the pixel 400 may be reduced. The pixel 400 may be applied to small-sized devices, for example, mobile phones.

Referring to FIG. 14B, the pixel 400' may include a photo sensor PS and a selection unit 401. The pixel 400' according to example embodiments may be a modification of the pixel 400 of FIG. 14A and may be described in terms of the difference therebetween. The pixel 400' may include a selection unit 401.

Figure 15:
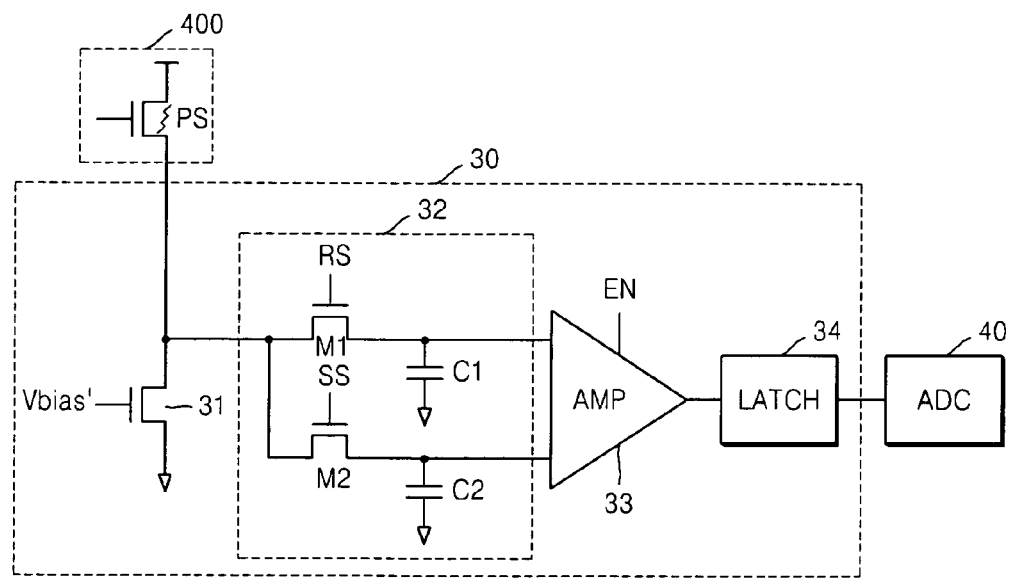

FIG. 15 is a circuit diagram of the pixel 400 of FIG. 14A, an optical detection signal generator 30 and an ADC 40 of an image sensor according to example embodiments. The optical detection signal generator 30 may include a conversion transistor 31, a sampling circuit 32, an amplifier 33 and a latch 34. An image sensor according to example embodiments may be a modification of the image sensor 1 of FIG. 7 and may be described in terms of the difference therebetween.

The conversion transistor 31 may convert first and/or second sense currents received from the photo sensor PS of the pixel 400 into first and/or second sense voltages, respectively. The sampling circuit 32 may include first and second switches M1 and M2 and first and second capacitors C1 and C2. The first switch M1 may be activated according to a reset sampling signal RS and may charge the first capacitor C1 according to the first sense voltage. The second switch M2 may be activated according to a set sampling signal SS and may charge the second capacitor C2 according to the second sense voltage. The amplifier 33 may be enabled according to an enable signal EN and may output an optical detection signal by amplifying a difference between voltages of the first and second capacitors C1 and C2 input thereto. The latch 34 may latch the optical detection signal received from the amplifier 33.

The operation of an image sensor according to example embodiments will now be described. When a first voltage V1 is applied to the gate of the photo sensor PS the photo sensor PS may output a first sense current. The conversion transistor 31 may convert the first sense current into a first sense voltage. When the reset sampling signal RS is "on" the first sense voltage may be supplied to the first capacitor C1. When a second voltage V2 is applied to the gate of the photo sensor PS, the photo sensor PS may output a second sense current. The conversion transistor 31 may convert the second sense current into a second sense voltage. When the set sampling signal SS is "on" the second sense voltage may be supplied to the second capacitor C2. When the enable signal EN is "on" the amplifier 33 may be activated and may generate an optical detection signal by amplifying a difference between voltages of the first capacitor C1 and the second capacitor C2 input thereto.

Figure 16:
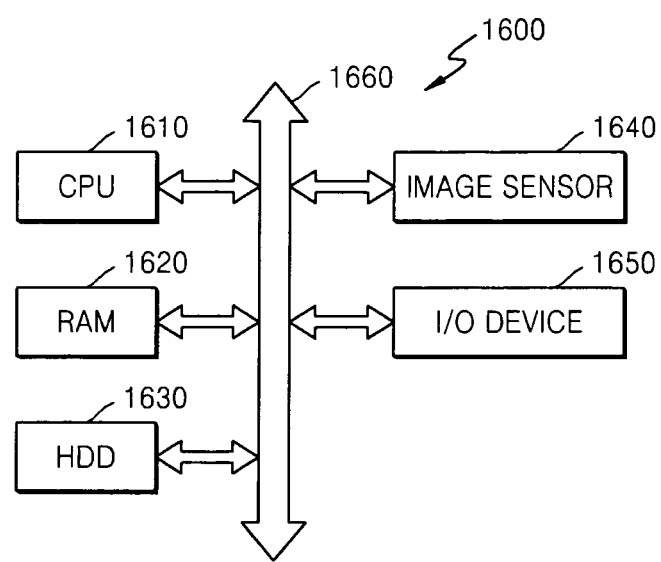

FIG. 16 is a block diagram schematically illustrating a processor-based system 1600 that includes an image sensor 1640. Referring to FIG. 16, the processor-based system 1600 may include a processor (CPU) 1610, a random access memory (RAM) 1620, a hard drive (HDD) 1630, an image sensor 1640 and an input/output (I/O) device 1650 which may communicate with one another via a bus 1660. The image sensor 1640 may be one of the image sensors described above with reference to FIGS. 1-15. The image sensor 1640 may receive a control signal and/or data from the processor 1610 and/or the other elements of the processor-based system 1600. The image sensor 1640 may supply a signal that defines an image based on the control signal and/or the data to the processor 1610. The processor 1610 may process the signal received from the image sensor 1640.

Examples of the processor-based system 1600 may include, for example, a digital circuit, a computer system, a camera system, a scanner, a video telephone, an electronic surveillance system, a vehicle navigation system, an automatic focus system, a star tracker system, a movement detection system, an image stabilization system, a data compression system, and/or other various systems that may include an image sensor according to example embodiments.

According to example embodiments, pixels included in a pixel array of an image sensor may include a photo sensor, the voltage-current characteristics of the photo sensor varying according to the amount and/or wavelength(s) of incident light. The image sensors according to example embodiments may have resolutions higher than those of conventional CMOS image sensors and/or CCD image sensors, and may not require a color filter.

A pixel of an image sensor according to example embodiments may include a reset unit for outputting a reference current and may be capable of enhancing a signal-to-noise ratio (SNR) of an output signal of the pixel using the reference current. The reference current may be used to compensate for variation in a sense current caused by, for example, PVT variables. A pixel may include a conversion unit for converting the sense current and the reference current into voltages, and an amplification unit for amplifying an output of the conversion unit. A pixel according to example embodiments may output amplified signals of the respective sense current and reference current. Accordingly, it may be possible to improve the resolution of an output signal of a pixel, and to minimize and/or reduce noise generated in the photo sensor, the reset unit and/or the conversion unit.

An output voltage of a conversion unit included in a pixel according to example embodiments may be controlled by applying a bias voltage to the conversion unit and offset noise may be reduced. A plurality of pixels included in the pixel array may share at least one of a reset unit, a conversion unit, an amplification unit, and a selection unit. A size of a pixel array may be reduced.

While example embodiments have been particularly shown and described, it will be understood by one of ordinary skill in the art that variations in form and detail may be made therein without departing from the spirit and scope of the claims.

What is claimed is:

1. An image sensor, comprising:
a pixel, the pixel including
a photo sensor, voltage-current characteristics of the photo sensor being variable based on an energy of incident light, the photo sensor being configured to generate a sense current based on the voltage-current characteristics and including at least one oxide transistor,
a reset unit configured to generate a reference current based on a reset signal, and
a conversion unit configured to convert the sense current into a sense voltage and the reference current into a reference voltage without a capacitor, the conversion unit being a transistor connected between the reset unit and a ground voltage source,
wherein the sense current generated by the photo sensor flows through the transistor to the ground voltage source, and
wherein, based on a bias voltage supplied to a gate of the transistor, the transistor controls a voltage of a node connected between the reset unit and the transistor.

2. The image sensor of claim 1, wherein the pixel further includes a transmission unit configured to pass the sense current to the conversion unit based on a set signal.

3. The image sensor of claim 2, wherein the pixel further includes an amplification unit configured to generate a sense signal by amplifying the sense voltage and a reference signal by amplifying the reference voltage, and
a selection unit configured to output the sense signal and the reference signal based on a selection signal.

4. The image sensor of claim 3, further comprising:
a row driver configured to supply the set signal, the reset signal, and the selection signal to the pixel;
an optical detection signal generator configured to generate an optical detection signal based on the sense signal and the reference signal; and
an analog-to-digital converter (ADC) configured to convert the optical detection signal into a digital signal.

5. The image sensor of claim 4, wherein the optical detection signal generator includes
a second conversion unit configured to convert the sense signal into a sense voltage signal and the reference signal into a reference voltage signal,
a sampling circuit configured to generate a reference output signal by sampling the reference voltage signal based on a reset sampling signal and a sense output signal by sampling the sense voltage signal based on a set sampling signal, and
an amplifier configured to generate the optical detection signal by amplifying a difference between the reference output signal and the sense output signal.

6. The image sensor of claim 5, wherein the optical detection signal generator further includes
a latch configured to latch the optical detection signal.

7. The image sensor of claim 3, wherein the pixel is a plurality of pixels, and
at least two of the plurality of pixels share at least one of the reset unit, the conversion unit, the amplification unit, and the selection unit.

8. The image sensor of claim 2, wherein the pixel further includes
a selection unit configured to output the sense voltage as a sense signal and the reference voltage as a reference signal, based on a selection signal.

9. The image sensor of claim 8, further comprising:
a row driver configured to supply the set signal, the reset signal and the selection signal to the pixel;
an optical detection signal generator configured to generate an optical detection signal based on the sense signal and the reference signal; and
an analog-to-digital converter (ADC) configured to convert the optical detection signal into a digital signal.

10. The image sensor of claim 9, wherein the optical detection signal generator includes
a sampling circuit configured to generate a reference output signal by sampling the reference signal based on a reset sampling signal and a sense output signal by sampling the sense signal based on a set sampling signal, and
an amplifier configured to generate the optical detection signal by amplifying a difference between the reference output signal and the sense output signal.

11. The image sensor of claim 8, wherein the pixel is a plurality of pixels, and
at least two pixels of the plurality of pixels share at least one of the reset unit and the conversion unit.

12. The image sensor of claim 2, wherein the transistor is switched based on an output of at least one of the transmission unit and the reset unit.

13. The image sensor of claim 1, wherein the transistor is switched based on the bias voltage.

14. The image sensor of claim 1, wherein the at least one oxide transistor includes at least one of ZnO and $TiO_2$.

15. A processor-based system, comprising:
the image sensor of claim 1; and
a processor communicating with the image sensor via a bus.

16. The image sensor of claim 1, wherein the at least one oxide transistor has an active layer that includes a metal oxide.

17. An image sensor, comprising:
a pixel, the pixel including
  a photo sensor, voltage-current characteristics of the photo sensor variable being based on an energy of incident light, the photo sensor being configured to generate a sense current based on the voltage-current characteristics and including at least one oxide transistor,
  a selection unit configured to output the sense current as a sense signal based on a selection signal, and
  a conversion unit configured to convert the sense signal into a sense voltage signal and a reference signal into a reference voltage signal without a capacitor, the conversion unit being a transistor connected between the selection unit and a ground voltage source,
  wherein the sense current generated by the photo sensor flows through the transistor to the ground voltage source, and
  wherein, based on a bias voltage supplied to a gate of the transistor, the transistor controls a voltage of a node connected between the selection unit.

18. The image sensor of claim 17, wherein the pixel further includes
the reset unit which is configured to generate the reference current based on a reset signal, and
the selection unit is configured to output the sense current as the sense signal and the reference current as the reference signal.

19. The image sensor of claim 18, wherein the pixel further includes
the transmission unit which is configured to pass the sense current to the selection unit based on a set signal.

20. The image sensor of claim 19, further comprising:
a row driver configured to supply the set signal, the reset signal, and the selection signal to the pixel;
an optical detection signal generator configured to generate an optical detection signal based on the sense signal and the reference signal; and
an analog-to-digital converter (ADC) configured to convert the optical detection signal into a digital signal.

21. The image sensor of claim 20, wherein the optical detection signal generator includes
a sampling circuit configured to generate a reference output signal by sampling the reference signal based on a reset sampling signal, and a sense output signal by sampling the sense voltage signal based on a set sampling signal, and
an amplifier configured to generate the optical detection signal by amplifying a difference between the reference output signal and the sense output signal.

22. The image sensor of claim 18, wherein
the pixel is a plurality of pixels, and
at least two pixels of the plurality of pixels share at least one of the reset unit and the selection unit.

23. The image sensor of claim 17, wherein the at least one oxide transistor has an active layer that includes a metal oxide.

24. A method of operating an image sensor of claim 1, comprising:
generating the sense current in the photo sensor of the pixel based on the energy of light incident onto the photo sensor, the voltage-current characteristics of the photo sensor variable based on the energy of the incident light; and
generating the reference current in the pixel based on the reset signal.

25. The method of claim 24, further comprising:
outputting the sense current and the reference current from the pixel based on a selection signal.

26. The method of claim 25, further comprising:
generating an optical detection signal based on the sense current and the reference current; and
converting the optical detection signal into a digital signal.

27. The method of claim 24, further comprising;
converting the sense current into a sense voltage and the reference current into a reference voltage; and
outputting the sense voltage and the reference voltage from the pixel based on a selection signal.

28. The method of claim 27, further comprising;
generating an optical detection signal based on the sense voltage and the reference voltage; and
converting the optical detection signal into a digital signal.

29. The method of claim 24, further comprising:
converting the sense current into a sense voltage and the reference current into a reference voltage;
generating a sense signal by amplifying the sense voltage and a reference signal by amplifying the reference voltage; and
outputting the sense signal and the reference signal from the pixel based on a selection signal.

30. The method of claim 29, further comprising:
generating an optical detection signal based on the sense signal and the reference signal; and
converting the optical detection signal into a digital signal.

* * * * *